United States Patent [19]
Taylor et al.

[11] 4,333,149
[45] Jun. 1, 1982

[54] MICROPROCESSOR-BASED STATE OF CHARGE GAUGE FOR SECONDARY BATTERIES

[75] Inventors: Dale F. Taylor; John S. Sicko, both of Schenectady, N.Y.; William S. Passman, Salem, Mass.

[73] Assignee: General Electric Company, Schenectady, N.Y.

[21] Appl. No.: 109,813

[22] Filed: Mar. 6, 1980

[51] Int. Cl.³ .................... G01N 27/42; G06F 15/56
[52] U.S. Cl. .................................... 364/481; 320/48; 324/433
[58] Field of Search ............................ 364/481, 483; 324/432-434, 76 A, 65 R, 62 R, 429, 428; 320/43, 44, 48

[56] References Cited
U.S. PATENT DOCUMENTS

| | | | |
|---|---|---|---|
| 3,778,702 | 12/1973 | Finger | 320/48 X |
| 3,969,667 | 7/1976 | McWilliams | 320/43 X |
| 4,017,724 | 4/1977 | Finger | 320/48 X |
| 4,021,718 | 5/1977 | Konrad | 320/48 |
| 4,051,424 | 9/1977 | Privee | 320/48 |
| 4,077,061 | 2/1978 | Johnston et al. | 364/483 |
| 4,153,867 | 5/1979 | Jungfer et al. | 320/48 X |
| 4,180,770 | 12/1979 | Eby | 324/429 |
| 4,181,885 | 1/1980 | Gosser et al. | 324/428 |

OTHER PUBLICATIONS

Design of Primary and Secondary Cells; C. M. Shepherd; Journal of Electrochemical Soc., Jul. 1965, vol. 112, pp. 657–664.

Primary Examiner—Edward J. Wise
Attorney, Agent, or Firm—William H. Steinberg; James C. Davis, Jr.; Marvin Snyder

[57] ABSTRACT

A state of charge gauge for measuring the state of charge of secondary batteries, such as the type employed in electric vehicles, includes a microprocessor which, when supplied with data varying in accordance with battery discharge current and battery terminal voltage, determines battery resistance. Having determined battery resistance which is a dynamically varying parameter dependent on battery temperature and age, the microprocessor computes the total battery charge capacity. Comparison of the quantity of battery charge already depleted with the previously computed total battery charge capacity yields an accurate indication of remaining battery charge.

11 Claims, 4 Drawing Figures

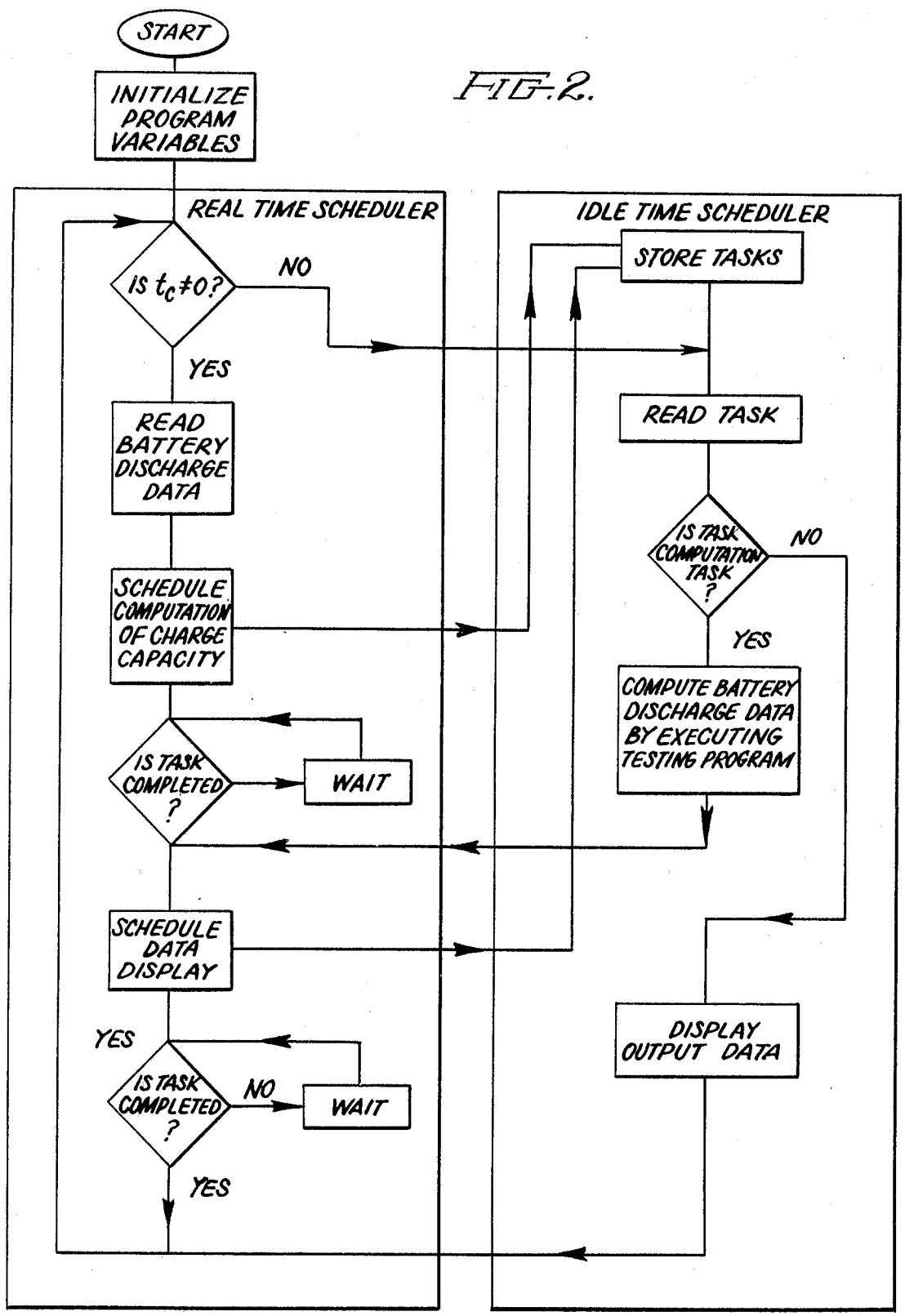

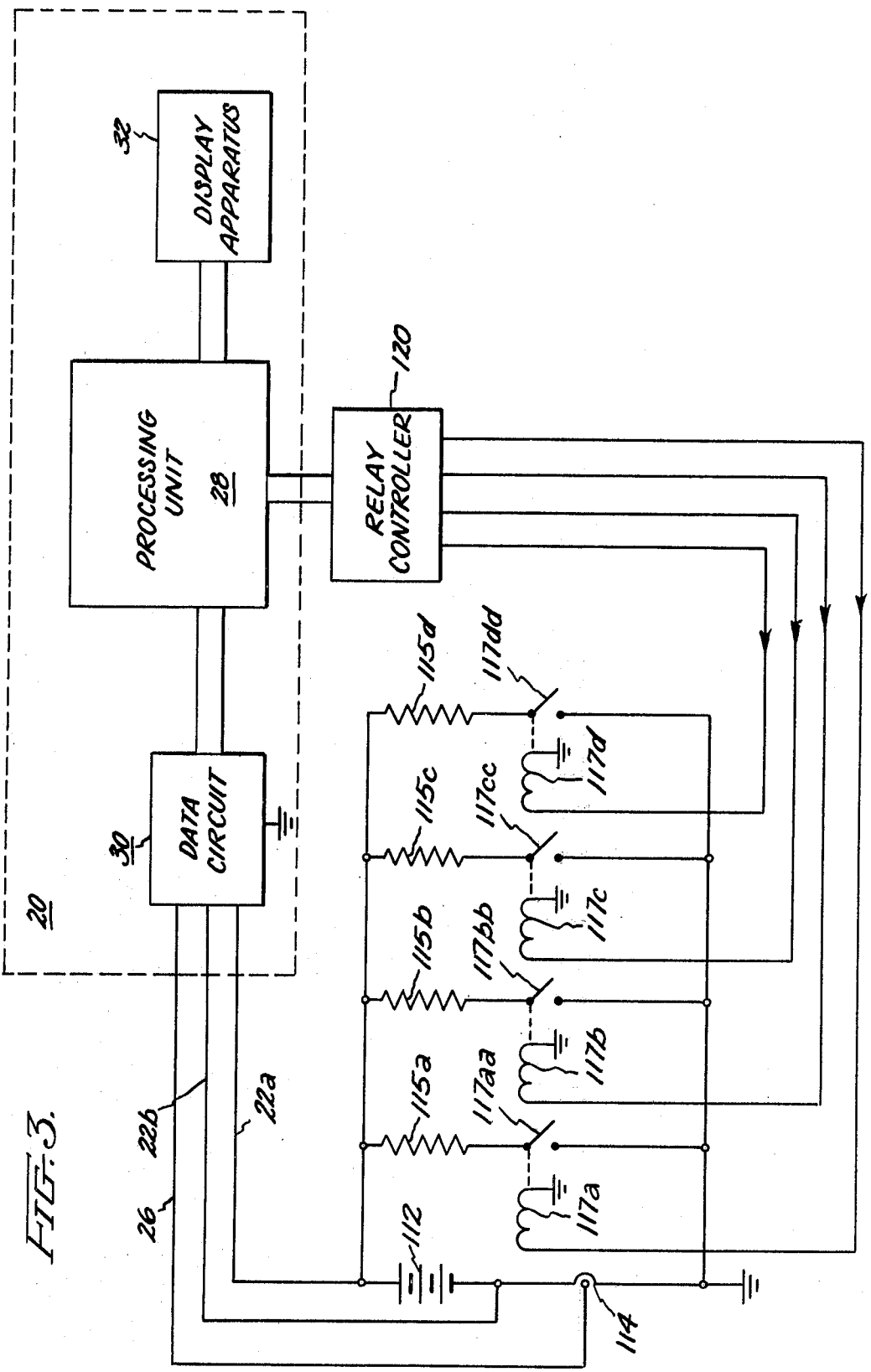

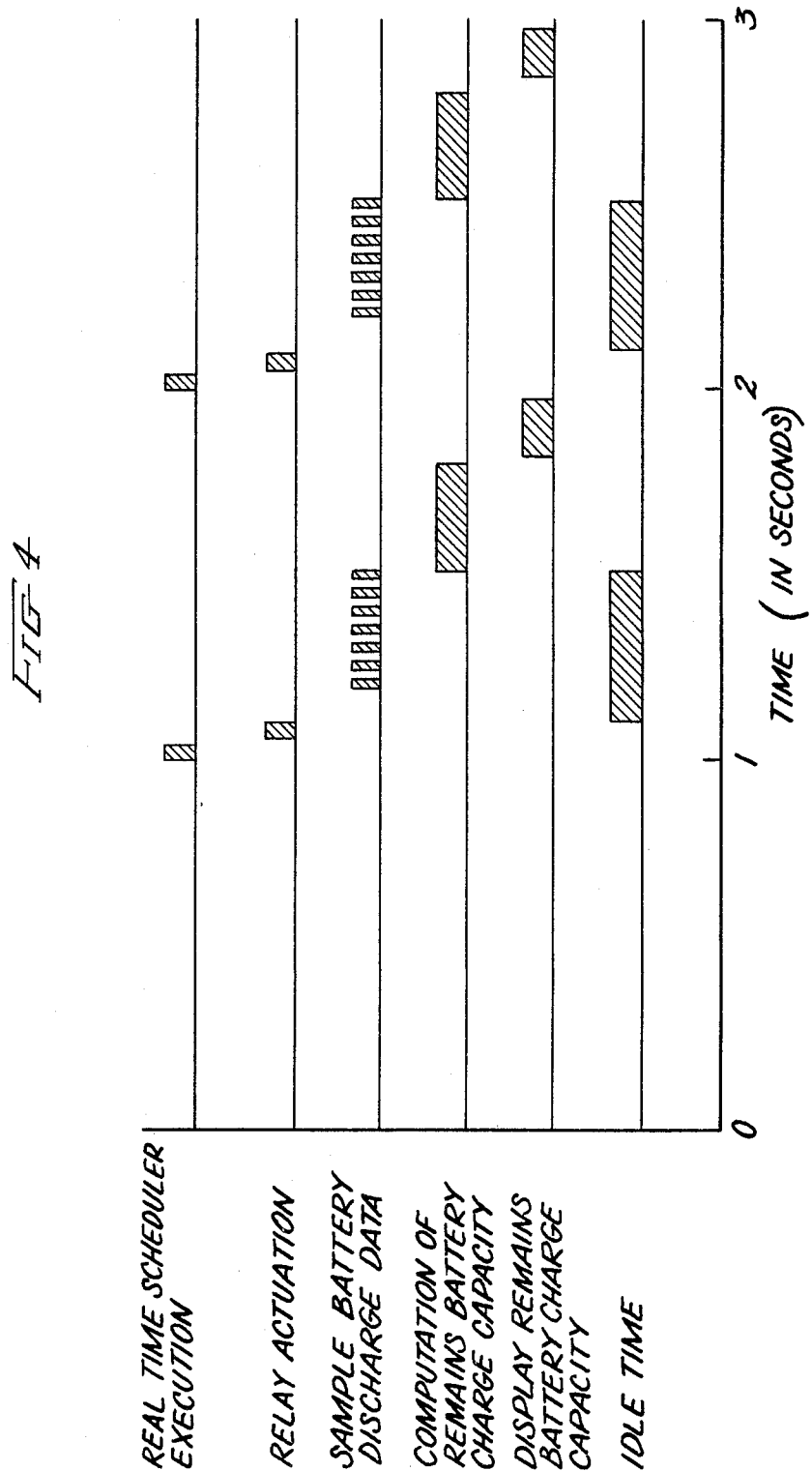

MICROPROCESSOR-BASED STATE OF CHARGE GAUGE FOR SECONDARY BATTERIES

BACKGROUND OF THE INVENTION

This invention relates to apparatus for measuring the state of charge of lead acid batteries, such as may be employed in an electric vehicle, and for providing output data indicative of battery charge.

Decreasing supplies of, and increasing prices for, refined petroleum products such as diesel fuel and gasoline have prompted increased interest in development of an electric vehicle suitable for short distance (i.e. less than 125 miles) travel. Because a sizable number of conventional internal combustion engine automobiles and trucks are only used to traverse such short distances, use of electric vehicles in their place could help lessen domestic dependence on expensive imported oil, as the energy required for electric vehicle battery charging could be supplied by hydroelectric or nuclear power stations.

The maximum range of the electric vehicle is dependent on the total charge capacity of vehicle batteries and battery charge depletion per mile in exactly the same manner that the range of a conventional internal combustion engine vehicle is dependent on fuel tank capacity and fuel consumption per mile. However, unlike conventional petroleum-fueled vehicles whose fuel tanks can quickly be refilled in a matter of minutes, recharging of electric vehicle batteries usually requires several hours. Therefore, an accurate indication of battery charge capacity is required to apprise electric vehicle user personnel of remaining battery charge so that the electric vehicle is not driven a distance beyond that which would permit safe return to a home base, or such other location where battery charging can readily be accomplished. To simplify electric vehicle operation, it would be desirable to display remaining battery charge in an analog fashion much the same way that the quantity of remaining fuel is displayed by conventional internal combustion engine vehicle fuel gauge.

Traditional means for determining the state of charge of secondary (i.e. rechargeable) batteries, such as the type used in electric vehicles, have included current integrating devices such as the electrochemical coulometer. The electrochemical coulometer determines the total charge, that is $$\int_o^T idt,$$

passing through a shunt circuit, by depositing an amount of indicating material, such as silver, at one side of an electrolysis cell proportional to the amount of charge passed during a given interval. Resetting of the electrochemical coulometer occurs during battery charging as battery charge current carries indicator material to the opposite side of the cell.

Electrochemical coulometers suffer from the disadvantage that the indication of battery charge capacity they provide does not vary in accordance with battery age or temperature. A "full charge" indication by the electrochemical coulometer may be particularly inaccurate at low battery temperatures, as battery charge capacity decreases substantially as battery temperature decreases. Battery charge capacity also decreases as battery age increases.

To remedy the disadvantage of such traditional means for determining secondary battery charge capacity, the present invention provides an indication of battery charge capacity in accordance with battery resistance, a dynamically varying parameter which is dependent on battery temperature and age.

BRIEF SUMMARY OF THE INVENTION

Briefly, in accordance with the preferred embodiment of the invention, a state of charge gauge for measuring the state of charge of secondary batteries, such as the lead acid type, and for providing a visual indication of remaining battery charge comprises a data circuit coupled to a secondary battery under load for providing a first and a second output signal proportional to the magnitude of battery discharge current and battery terminal voltage, respectively. A processor unit, coupled to the data circuit, computes battery dynamic resistance and generates a signal indicative of total battery charge capacity. Comparison of total battery charge capacity with the quantity of battery charge already depleted yields an output signal, which is proportional to remaining battery charge. A visual indication of remaining battery charge is provided by a display apparatus, typically comprised of an analog meter, in accordance with the processor unit output signal.

It is an object of the present invention to provide apparatus for measuring the charge capacity of secondary batteries and for providing a visual indication of battery remaining charge.

It is another object of the present invention to provide apparatus for measuring the charge capacity of secondary batteries and for providing a visual indication of remaining battery charge which is compensated for battery temperature and battery age.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 2 is a flow chart diagram of the monitor program executed by the state of charge indicator of FIG. 1 during operation;

FIG. 3 is a block diagram of a battery tester employing the state of charge indicator of FIG. 1; and FIG. 4 is a timing diagram illustrating the operation of the battery tester of FIG. 3.

DETAILED DESCRIPTION OF THE PREFERRED EMBODIMENT

Figure 1:
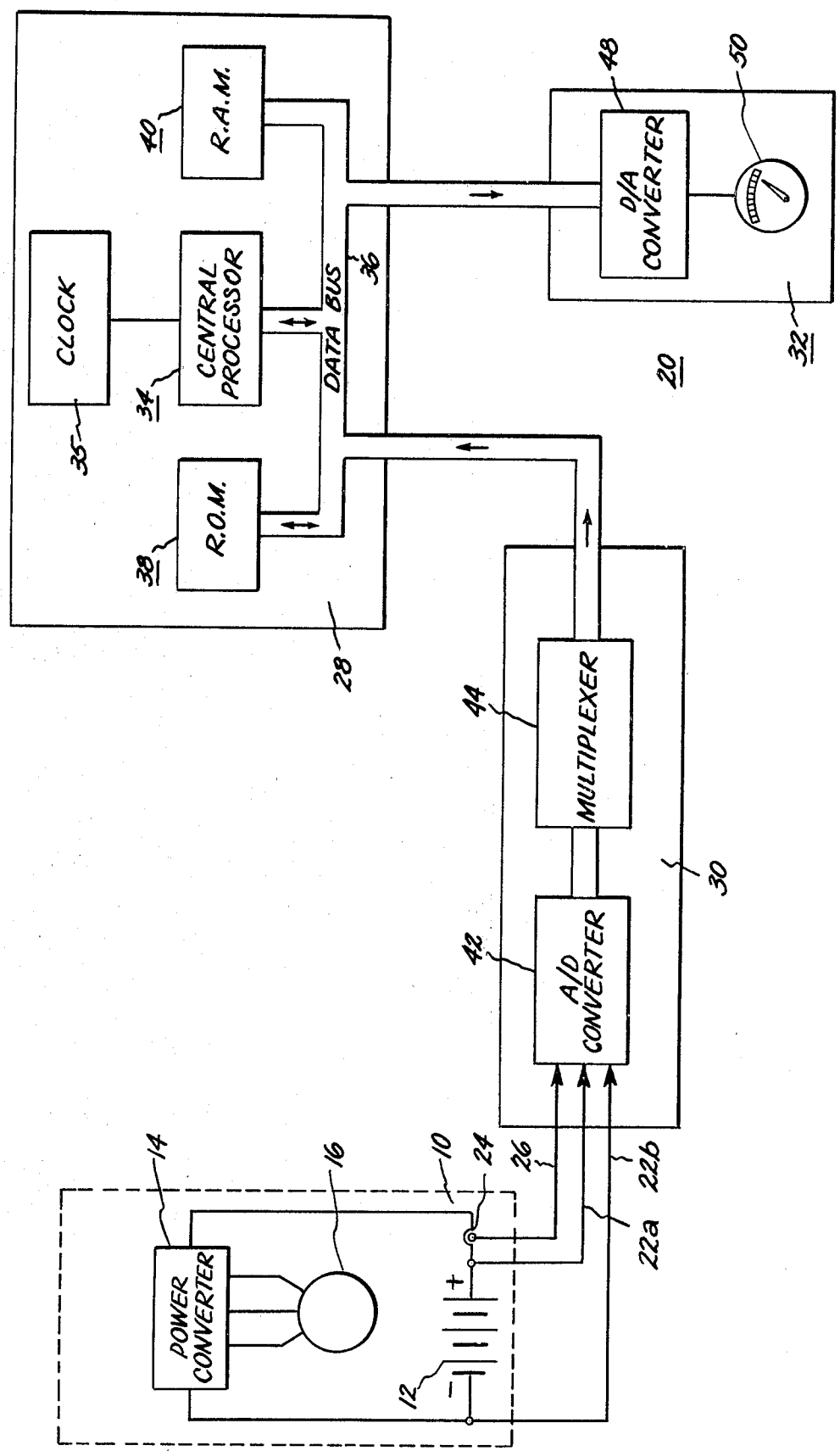
FIG. 1 is a block diagram of a state of charge indicator according to the present invention, as employed in measuring the state of charge of secondary batteries within an electric vehicle.

FIG. 1 illustrates an electric vehicle drive system 10 comprising a battery 12, configured of one or more lead acid cells. Battery 12 is coupled to a power converter 14 which supplies electrical energy to a traction motor 16 connected thereto. The nature of traction motor 16 determines the structure of power converter 14. Thus, if traction motor 16 comprises a synchronous or induction alternating current motor, power converter 14 would then be comprised of an inverter.

A state of charge indicator 20, according to the present invention, for on-board electric vehicle use is coupled to the positive and negative terminals of battery 12 via conductors 22a and 22b, respectively, and is coupled to a current sensor 24, coupled in series with battery 12 and power converter 14, via conductor 26. Charge indicator 20 provides a visual indication of the remaining charge of battery 12 in accordance with battery terminal voltage and discharge current and includes a processing unit 28, which, when supplied with data from a data circuit 30 proportional to the magnitude of battery discharge current and battery terminal voltage, computes remaining battery charge and provides an output signal indicative thereof to display apparatus 32.

Determination of remaining battery charge by processing unit 28 is achieved by reliance on the relationship between battery terminal voltage and discharge current determined empirically by C. M. Shepherd in his paper "Design of Primary and Secondary Cells" published in the Journal of the Electrochemical Society in July 1965 in Volume 112 at pages 657–664. Shepherd states that constant current discharge data for secondary batteries, such as the lead acid type, can be given fairly accurately by equation (1):

$$E = E_s - Ni - (Q/(Q-it))Ki \quad (1)$$

where
- $E$ = battery terminal voltage
- $E_s$ = a fitted constant representative of a reference voltage which is substantially close in magnitude to the open circuit battery terminal voltage
- $Q$ = a fitted constant representative of a reference battery charge capacity which is indicative of battery charge capacity at low discharge rates
- $N$ = a fitted constant representative of internal battery resistance
- $K$ = a fitted constant representative of the coefficient of battery polarization
- $i$ = battery discharge current
- $t$ = time Equation (1) can be rearranged to describe a dynamic resistance r as seen by equation (2)

$$r = (E_s - E)/i = N + QK/(Q-it) \quad (2)$$

which resistance, for a battery in a given condition, that is, at a given temperature and age, varies only as a degree of battery discharge. Examination of equation (2) yields the conclusion that resistance r is independent of the rate of battery discharge and thus, is indicative of total battery charge capacity.

Equation (2) can itself be rearranged to yield $$r = K + N + (it/Q)(r-N) \quad (3)$$

In practice, r quickly becomes very much larger than N shortly after commencement of battery discharge. With $r >> N$ shortly after commencement of battery discharge, $$\Delta \left[ r \int_o^T idt \right] / \Delta r$$

yields a value for Q, the total battery charge capacity. Thus, measurement of battery discharge current and battery terminal voltage, and integration of battery discharge current with respect to time, allow calculation of total battery charge capacity for a given battery temperature and age. By subtracting $$\int_o^T idt,$$

the amount of charge depleted from the total battery capacity Q during the interval commencing from the inception of battery discharge until the present, a value $Q_r$ representative of remaining battery charge can be obtained.

At the inception of battery discharge, when the disparity between r and N is not as great as during the latter stages of battery discharge, some correction for Q may be required. Such correction for Q may be obtained from successive values of r and q, where $$q = \int_O^T idt. \quad (4)$$

Substituting the value of $$\int_o^T idt$$

set forth in equation (4) into equation (3) yields $$r = K + N + (q/Q)(r-N) \quad (5)$$

Upon examination of equation (5), it is evident that when $r >> N$, as is the case for latter stages of battery discharge, a plot of r vs rq will be linear with a slope of 1/Q. Knowledge of this fact allows accurate correction of Q from 3 separate values of r and q, such as $r_1$, $r_2$ and $r_3$, respectively, and $q_1$, $q_2$ and $q_3$, respectively, as follows:

$$Q_{12} = (r_2 q_2 - r_1 q_1)/(r_2 - r_1) \quad (6)$$

$$Q_{23} = (r_3 q_3 - r_2 q_2)/(r_3 - r_2) \quad (7)$$

However, the actual total battery charge capacity Q is obtained from a plot of r vs (r−N)q so that $$Q = [(r_2 - N)q_2 - (r_1 - N)q_1]/(r_2 - r_1) \quad (8)$$
$$= [(r_3 - N)q_3 - (r_2 - N)q_2]/(r_3 - r_2)$$

and thus $$Q = Q_{12} - N(q_2 - q_1)/(r_2 - r_1) = Q_{23} - N(q_2 - q_2)/(r_3 - r_2) \quad (9)$$

Solving equation (9) for N and substituting the resulting value back into equation (8) yields two expressions for Q one of which is as follows:

$$Q = Q_{23} - \frac{(Q_{23} - Q_{12})(q_3 - q_2)/(r_3 - r_2)}{\frac{(q_3 - q_2)}{(r_3 - r_2)} - \frac{(q_2 - q_1)}{(r_2 - r_1)}} \quad (10)$$

If $q_3 - q_2 = q_2 - q_1$ then $$Q = Q_{23} - \Delta Q(r_2 - r_1)/(2r_2 - r_1 - r_3) \qquad (11)$$

or $$Q = Q_{12} - \Delta Q(r_3 - r_2)/(2r_2 - r_1 - r_3) \qquad (12)$$

where $$\Delta Q = Q_{23} - Q_{12} \qquad (13)$$

To compute the remaining battery charge, $Q_r$, that is the difference between Q and $$\int_o^T i \, dt,$$

in accordance with equations (1) through (13) above, processing unit 28 comprises a central processor 34 which is typically configured of a microprocessor such as the Model 8080A microprocessor manufactured by Intel Corporation. Coupled to central processor 34 is a clock 35 configured to generate an interrupt every 1/60th of a second. A bidirectional data bus 36 couples central processor 34 to a 2K read only memory (ROM) 38 and to a 1K random access memory (RAM) 40. Read only memory 38 contains two programs, a monitor program, described more fully below, which schedules the acquisition of battery discharge data and execution of a testing program which computes remaining battery charge from battery discharge data, and a floating point arithmetic program executed in conjunction with the testing program. Random access memory 40 stores the testing program prior to execution by central processor 34.

Data bus 36 also connects central processor 34 to data circuit 30, which, in the presently illustrated embodiment, comprises a two channel analog to digital converter 42, coupled at the first input via conductors 22a and 22b, to battery 12 and coupled at the second input to current sensor 24, via conductor 26. A multiplexer 44 time-multiplexes the digital battery discharge data provided by analog to digital converter 42 prior to transmission to central processor 34.

Display apparatus 32 is also coupled to central processor 34 via data bus 36 and, in the presently illustrated embodiment, display apparatus 34 comprises a digital to analog converter 48 for converting digital output data generated by central processor 34 into an analog voltage which is supplied to a meter 50 configured to display remaining battery charge in accordance with the magnitude of output voltage supplied by digital to analog converter 48. Although not shown, display apparatus 32 could also be configured of a data communications terminal or a digital display, comprised of either light emitting diodes or liquid crystal display cells coupled to suitable amplifier circuitry to drive such devices in accordance with output data supplied by central processor 34.

FIG. 2 is a simplified flow chart diagram of the monitor program contained within read only memory 38 which is executed during battery charge indicator 20 operation. The monitor program consists of a real time scheduler and an idle time scheduler. During execution of the real time scheduler portion of the monitor program, scheduling of data acquisition and scheduling of the battery testing program and the floating point arithmetic program execution is initiated, while during execution of the idle time scheduler portion of the monitor program, performance of scheduled tasks occurs.

At the inception of monitor program execution, program variables are each initialized at zero and clock 35 is rendered operative to generate an interrupt signal every 1/60 of a second. When the clock interrupt signal magnitude $t_c$ is unequal to zero, as is the case each time an interrupt occurs, battery discharge data is obtained from battery 12 via data circuit 30, both shown in FIG. 1, and is stored in RAM 40 memory. Execution of both the battery testing program and the floating point arithmetic program to compute battery resistance and remaining battery charge is then scheduled. Once remaining battery charge is computed, display of remaining battery charge is then scheduled. When display of remaining battery charge is completed, re-execution of the monitor program is commenced.

During the "idle time," that is the time between the completion of execution of the real time scheduler portion of the monitor program and the occurrence of a succeeding clock interrupt signal, execution of the battery testing program and the floating point arithmetic program is commenced and display of the value of remaining battery charge previously computed during battery testing program and floating point arithmetic program execution, is accomplished. Each time computation of remaining battery charge, or display of the computed value of remaining battery charge is scheduled, the task is stored in memory. During the execution of idle time scheduler portion of the monitor program, these tasks are performed and execution of the real time scheduler portion of the monitor program is resumed following the occurrence of a clock interrupt signal.

The charge indicator apparatus of the present invention can also be configured with a discharge apparatus to provide a stand alone battery tester, as shown in FIG. 3 for discharging secondary batteries and for profiling battery charge during battery discharge intervals. The battery tester of FIG. 3 comprises a state of charge indicator 20, including a data circuit 30, configured identically to data circuit 30 of FIG. 1. Data circuit 30 is coupled to a lead acid battery 112 via conductors 22a and 22b, and is coupled via conductor 26 to a current sensor 114 which is coupled in series with battery 112 and the serial combination of a load, shown as resistance 115a, and relay the contacts 117aa of a relay 117a. Coupled in parallel with resistance 115a and the contacts 117aa of relay 117a is the serial combination of resistance 115b and the contacts 117bb of relay 117b, the serial combination of resistance 115c and the contacts 117cc of relay 117c, and the serial combination of resistance 115d and the contacts 117dd of relay 117d. Typically, resistances 115a–115d are each equal in ohmic value, with the ohmic value of each being selected such that when each of relays 117a–117d is activated or energized, 30 amperes of battery current passes through each of resistances 115a–115d, respectively.

Each of relays 117a–117d is coupled to a relay controller 120, which is typically comprised of a solid state stepper relay or the like. Relay controller 120 is coupled to processing unit 28 of charge indicator 20, which processing unit configured identically to processing unit 28 of FIG. 1. Processing unit 28 is also coupled to data circuit 30. During operation, processing unit 28 supplies relay controller 120 with a discharge command signal and, in accordance therewith, relay controller 120 activates one or more of relays 117a–117d to commence battery discharge. In accordance with battery discharge data supplied thereto by data circuit 30, processing unit 28 computes remaining battery charge which is visually displayed on a display apparatus 32 coupled to the processing unit. Typically, display apparatus 32 comprises a data communications terminal, such as the General Electric Terminet ® data communications terminal.

Operation of the battery tester of FIG. 3 may best be understood by reference to the battery tester timing diagram of FIG. 4. As illustrated, the processing unit commences execution of the real time scheduler portion of monitor program to command activation of one or more relays once every second thereby initiating battery discharge. A predetermined time interval after relay activation, battery discharge data is scheduled to be sampled N times, where N is greater than 2 e.g. 7 as illustrated. By waiting to sample battery discharge data until after a predetermined time interval has elapsed following relay activation, the occurrence of spikes or notches in the sampled battery discharge current and terminal voltage will be greatly reduced. Accuracy of the sampled battery discharge data is increased by frequent repeated samplings, as such frequent repeated samplings effect digital filtering of battery discharge data, thereby reducing any error that may be attributable to extraneous noise. After sampling of the battery discharge current and battery terminal voltage, execution of the battery testing program and the floating point arithmetic program is commenced to compute remaining battery charge capacity, which is thereafter visually displayed. The periods of idle time occur during data sampling when the central processor does no work.

The foregoing describes a microprocessor based state of charge indicator for providing a visual indication of remaining battery charge in accordance with battery discharge current and battery terminal voltage and which adjusts for battery temperature and age.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A state of charge indicator for measuring the state of charge of secondary batteries and for providing a visual indication of remaining battery charge comprising:
    a data circuit adapted to be coupled to a secondary battery under load for providing first and second output signals proportional to the magnitude of battery discharge current and battery terminal voltage, respectively;
    processing means coupled to said data circuit for computing battery dynamic resistance in accordance with the magnitude of battery discharge current and the magnitude of battery terminal voltage and for computing total battery charge capacity in accordance with battery dynamic resistance and battery charge already delivered and determining the remaining battery charge by comparing total battery charge capacity with battery charge already delivered; and
    display apparatus coupled to said processor unit for providing a visual indication of remaining battery charge determined by said processor unit.

2. The invention according to claim 1 wherein said data circuit comprises:
    an analog to digital converter adapted to be coupled to said battery under load and providing digital output data proportional to the magnitude of battery discharge current and battery terminal voltage; and
    a multiplexer coupled to said analog to digital converter for time multiplexing said analog to digital converter output data.

3. The invention according to claim 1 wherein said processing unit comprises:
    a first memory for storing a battery testing program
    a second memory for storing a floating point arithmetic program which is executed in conjunction with said battery testing program stored in said first memory, and for storing a monitor program; and
    a central processor coupled to said first and said second memories for executing said monitor program and, in accordance with said monitor program, executing said battery testing program and said floating point arithmetic program to provide, in accordance with the magnitude of battery terminal voltage and battery discharge current, a digital output signal representative of remaining battery charge.

4. The invention according to claim 3 wherein said first memory comprises a random access memory.

5. The invention according to claim 3 wherein said second memory comprises a read-only memory.

6. The invention according to claim 3 wherein said central processor comprises a microprocessor.

7. The invention according to claim 1 wherein said display apparatus comprises:
    a digital to analog converter coupled to said processing unit for converting said processing unit output into an analog voltage; and
    meter means for visually indicating said digital to analog converter output voltage.

8. A battery tester for discharging a secondary battery and for providing a visual indication of remaining battery charge capacity during battery discharge intervals, comprising:
    discharge apparatus adapted to be coupled to a secondary battery for discharging said battery in accordance with a discharge command signal; and
    a state of charge indicator which includes:
        a data circuit coupled to said battery for providing first and second output signals proportional to the magnitude of battery discharge current and battery terminal voltage, respectfully;
        processing means coupled to said data circuit and said discharge apparatus for supplying said discharge apparatus with said discharge command signal, and for computing battery dynamic resistance in accordance with the magnitudes of battery discharge current and battery terminal voltage and for computing total battery charge capacity, in accordance with battery dynamic resistance and battery charge already delivered by the battery and determining the remaining battery charge capacity from the difference between total battery charge and battery charge already delivered; and
        display apparatus coupled to said processing means for providing a visual indication of battery charge determined by said processing means.

9. A method for determining the state of charge of secondary batteries under load comprising the steps of:
(1) sampling battery discharge current and battery terminal voltage;
(2) computing battery dynamic resistance in accordance with the magnitude of sampled battery terminal voltage and battery discharge current;
(3) computing battery total charge capacity from the time discharge begins from the dynamic resistance and the amount of charge the battery has delivered from the start of discharge;
(4) comparing the battery total charge capacity with the amount of charge the battery has delivered from the start of discharge to produce the remaining battery charge; and
(5) visually displaying an indication of remaining battery charge.

10. The method according to claim 9 further comprising the steps of:
(6) repeating steps (1) and (2);
(7) recomputing total charge capacity from the time discharge begins to update the calculated initial battery total charge capacity from the dynamic resistance and the amount of charge the battery has delivered from the start of discharge;
(8) repeating step (4) and (5);
(9) repeating steps (6–8) at least once.

11. The method according to claim 9 wherein said step of computing battery dynamic resistance further comprises the steps of determining the difference between a predetermined voltage and the sampled battery voltage and dividing the result by the sampled battery current.

* * * * *